United States Patent [19]

Byrd

[11] Patent Number: 5,528,460

[45] Date of Patent: Jun. 18, 1996

[54] BATTERY HOLDER FOR A PRINTED CIRCUIT BOARD

[75] Inventor: Timothy J. Byrd, Goffstown, N.H.

[73] Assignee: AEG Schneider Automation, Inc., No. Andover, Mass.

[21] Appl. No.: 309,914

[22] Filed: Sep. 21, 1994

[51] Int. Cl.⁶ .................................................. H05K 5/00
[52] U.S. Cl. .......................... 361/752; 361/796; 361/815; 429/96; 307/150
[58] Field of Search ..................................... 361/728, 729, 361/752, 796, 815, 820; 439/217, 218, 500, 627, 698; 429/100, 96–99, 164, 121; 307/150

[56] References Cited

U.S. PATENT DOCUMENTS

| | | |
|---|---|---|
| 3,181,974 | 5/1965 | Barbera . |
| 4,083,011 | 4/1978 | Ferrell et al. ............................ 325/352 |
| 5,211,579 | 5/1993 | Seong et al. ............................ 439/500 |
| 5,395,263 | 3/1995 | Sandell .................................. 439/500 |

*Primary Examiner*—Leo P. Picard
*Assistant Examiner*—Y Whang
*Attorney, Agent, or Firm*—Ware, Fressola, Van Der Sluys & Adolphson

[57] ABSTRACT

A battery holder (25) holds a battery (27) in spaced relation to a printed circuit board (30), sufficient space (43) being provided between the printed circuit board (30) and the battery (27) for mounting of circuit components (47,49) on the printed circuit board (30) between the battery holder and the printed circuit board. A connection is provided between a connector (85) mounted on the printed circuit board (30) and a connector (82) mounted on leads (78) which are attached to the battery (27), the connection providing for the electrical connection and disconnection of the battery (27) and the printed circuit board (30). A housing (10) is provided for mounting the printed circuit board (30), battery holder (25) and battery (27) therein. The battery holder (25) is provided with a deformable retention clip (56) for retention of the battery (27) within a chamber (50,51) the holder (25), and in response to actuation by an operator, removal of the battery from the holder.

20 Claims, 2 Drawing Sheets

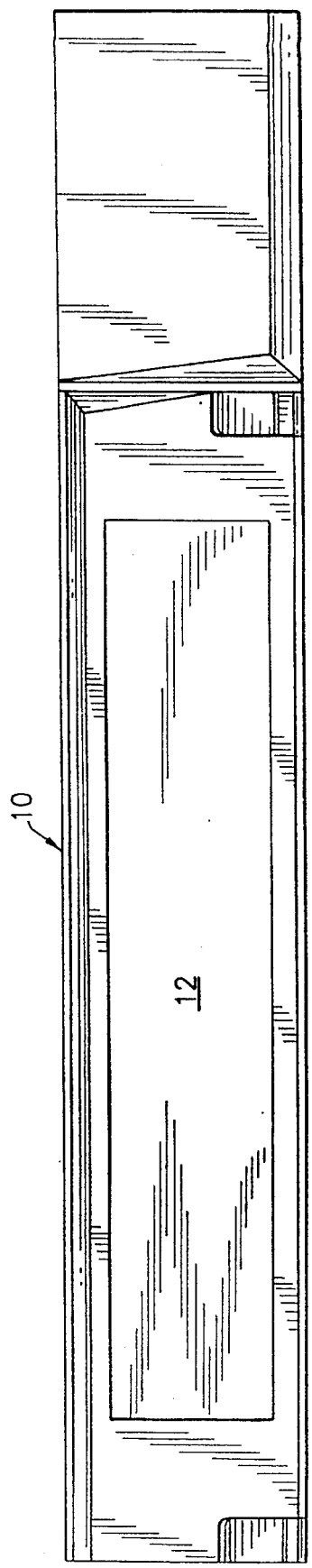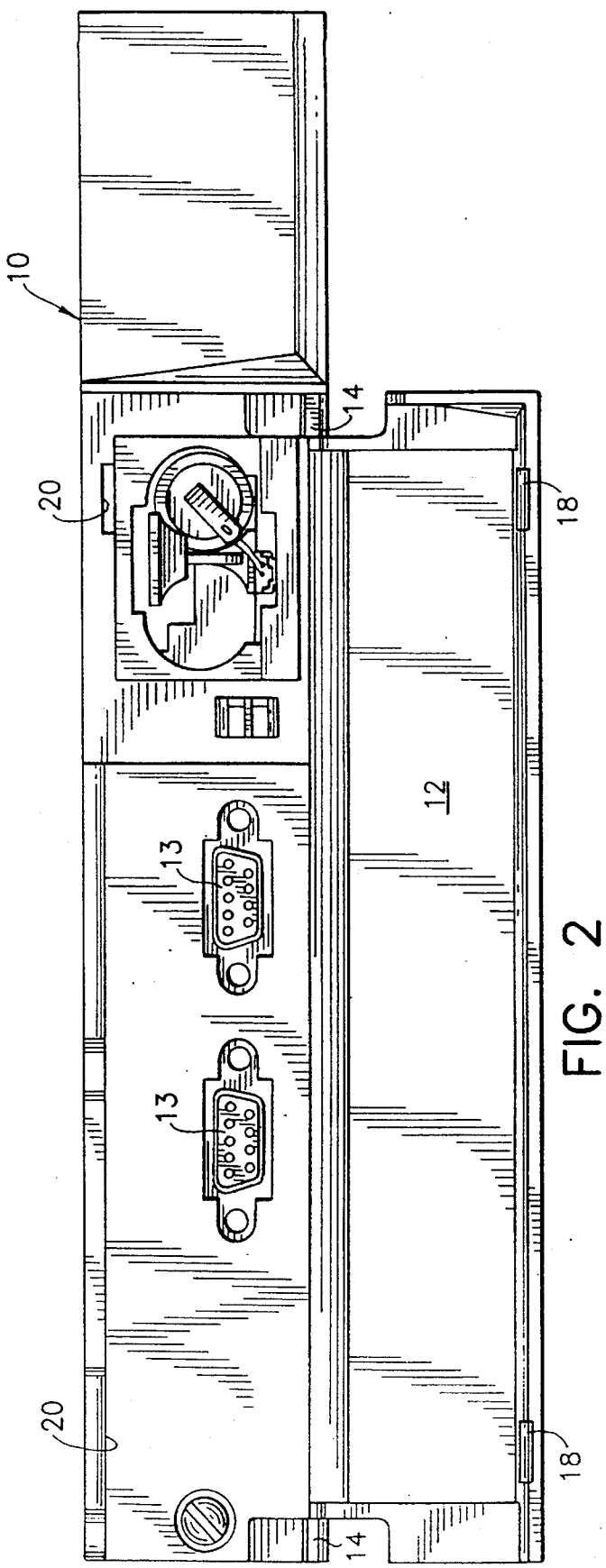

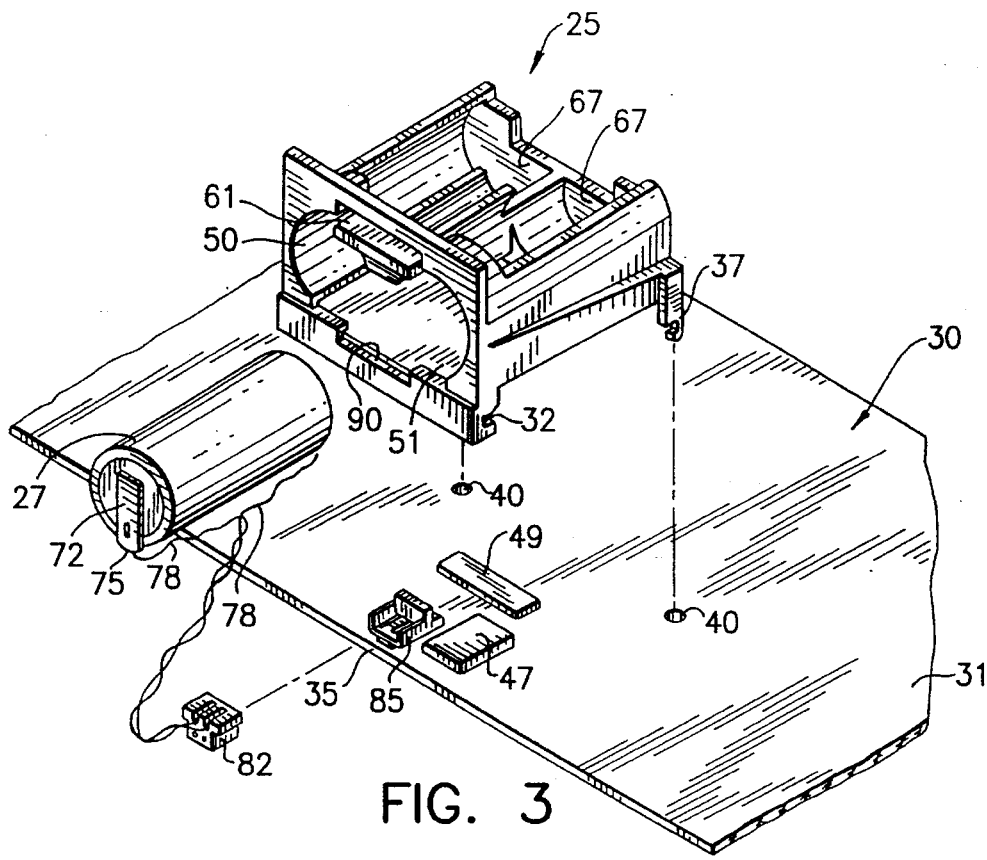
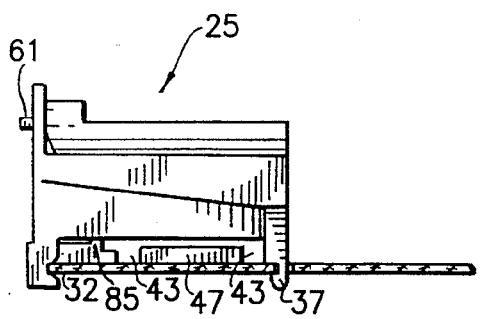
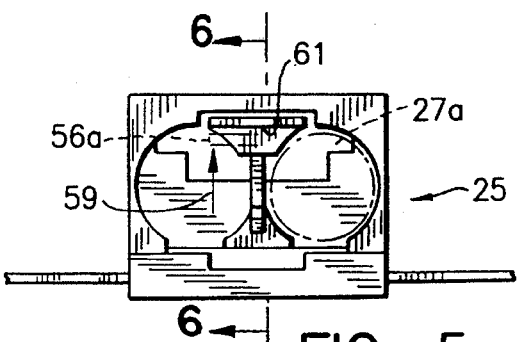
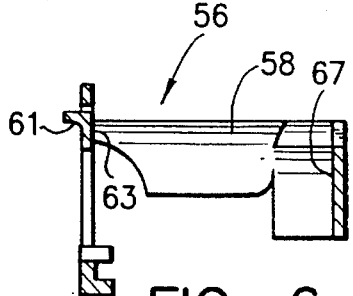

BATTERY HOLDER FOR A PRINTED CIRCUIT BOARD

TECHNICAL FIELD

The present invention relates to a battery holder, and more particularly, to a battery holder for holding a battery in spaced relation to a printed circuit board.

BACKGROUND OF THE INVENTION

It is well known to use a battery as either a primary or backup power supply for circuit components mounted on a printed circuit board. One method of supplying battery power to a printed circuit board is to provide a battery at a separate or remote location from the printed circuit board and provide a connector on the printed circuit board for connection to leads from a battery holder wherein the battery is mounted. One problem associated with a configuration of this type is that in most printed circuit board applications, space is a major concern, and providing the battery holder and battery separate from the printed circuit board may consume more space than desired. Additionally, long lengths of wires or leads from the battery holder to the printed circuit board may increase undesired resistance losses. Finally, if the printed circuit board is provided as a module, the separation of the battery holder and printed circuit board may increase the overall size of the module.

Another method of providing battery power to a printed circuit board is to provide a battery holder directly mounted on a printed circuit board. However, a battery is typically large in comparison to other components mounted on a printed circuit board, and may take up a large amount of space that could be otherwise allocated to circuit components.

DISCLOSURE OF THE INVENTION

Objects of the invention include the provision of a printed circuit board having a battery holder for holding a battery in spaced relation to the printed circuit board, the printed circuit board and battery holder providing for an electrical connection between the battery and the printed circuit board.

Another object of the present invention is to provide a battery holder for holding a battery in spaced relation to a printed circuit board which allows for the mounting of circuit components between the battery and the printed circuit board.

A still further object of the present invention is to provide a modular printed circuit board having a battery power supply mounted thereon, the module providing for easy access for the installation and removal of a battery, and the battery being mounted in a holder which allows the mounting of components on the printed circuit board between the printed circuit board and the battery.

According to the present invention, a battery holder holds a battery in spaced relation to a printed circuit board, the holder providing sufficient space between the printed circuit board and a battery received within a chamber of the battery holder for mounting of circuit components on the printed circuit board between the battery holder and the printed circuit board.

In further accord with the present invention, a connection is provided between a connector mounted on the printed circuit board and a connector mounted on leads which are attached to the battery, the connection providing for the electrical connection and disconnection of the battery and the printed circuit board.

In still further accord with the present invention, a housing is provided for mounting the printed circuit board, battery holder and battery therein, the housing having an access for connection of the printed circuit board to a back plane, the housing further providing access to the battery holder and printed circuit board connection for insertion of the battery into the holder and connection of the battery connector to the printed circuit board connector and also for removal of the battery from the holder and disconnection of the battery connector from the printed circuit board connector.

According still further to the present invention, the holder is provided with a deformable retention clip for retention of the battery within the holder, and in response to actuation by an operator, removal of the battery from the holder.

The battery holder of the present invention provides a significant improvement over the prior art by allowing the mounting of a battery within a holder on a printed circuit board so that circuit components can be mounted on the printed circuit board between the battery and the printed circuit board. Additionally, the holder allows for the secure retention of the battery within the holder, and for easy removal of the battery from the holder in response to operator actuation of a retention clip. Snap fit connection is provided between a connector mounted on the printed circuit board and a connector mounted to leads attached to the battery for electrical connection of the printed circuit board and the battery. A housing may be provided for retaining the printed circuit board, battery holder and battery. The housing allows easy access to the battery holder, battery and connector so that a battery may be easily installed or removed from the holder and electrical connection may be established or removed from the battery and the printed circuit board without removing the printed circuit board from the housing.

The foregoing and other objects, features and advantages of the present invention will become more apparent in light of the following detailed description of exemplary embodiments thereof, in view of the accompanying drawings.

BRIEF DESCRIPTION OF THE DRAWINGS

FIG. 1 is a front view of a housing containing a printed circuit board having the improved battery holder of the present invention;

FIG. 2 is a front view of the housing of FIG. 1 showing an access door of the housing open for allowing access to the improved battery holder of the present invention;

FIG. 3 is an exploded perspective view of the improved battery holder, partially broken away, in relation to a printed circuit board, and also showing a battery for insertion in the battery holder and connectors for establishing an electrical connection between the battery and the printed circuit board;

FIG. 4 is a side view of the improved battery holder mounted on the printed circuit board of FIG. 3, showing circuit components mounted beneath the improved battery holder on the printed circuit board;

FIG. 5 is a front view of the battery holder and circuit board of FIG. 3 showing a retention clip in an actuated position and showing a battery inserted in a right receptacle of the holder in phantom; and FIG. 6 is a sectional view taken along line 6—6 of FIG. 5.

BEST MODE FOR CARRYING OUT THE INVENTION

The improved battery holder of the present invention is particularly well suited for holding a battery in spaced relation to a printed circuit board thereby allowing the mounting of circuit components on the printed circuit board between the battery holder and the printed circuit board. Additionally, the improved battery holder allows for the easy installation and removal of a battery in a chamber of the holder. Connector means are also provided so that an electrical connection can be easily established between the battery and the printed circuit board.

Referring to FIG. 1, a housing 10 may be provided to house a printed circuit board having an improved battery holder in accordance with the present invention. Referring also to FIG. 2, the housing 10 may be provided with an access door 12 which allows access to the battery holder 25 and various other connectors or components 13 mounted on or connected to the printed circuit board. Additionally, the housing 10 may be provided with a suitable access (not shown) for connection of the printed circuit board to a back plane. Alternatively, the housing and printed circuit board may be provided with various types of connections known in the art (not shown) for connection of the printed circuit board in various circuit configuration as desired.

The access door 12 is mounted to the housing 10 via hinges 14 for allowing swinging movement of the access door 12 with respect to the housing 10. Fastening means 18, e.g., tabs, may be provided on the access door for mating engagement with retention surfaces 20 on the housing for holding the access door in contact with the housing in a closed position as illustrated in FIG. 1.

Referring now to FIGS. 2 and 3, when the access door 12 is in the open position, access is provided to the battery holder 25 for allowing the insertion and removal of batteries 27 in the battery holder 25.

The battery holder 25 is provided with a combination of mounting means for mounting to a printed circuit board 30. Although not illustrated in FIG. 3, the printed circuit board typically includes a plurality of circuit components mounted on one side 31, and electrical connections between the various circuit components on both sides thereof. The mounting means for mounting the battery holder 25 to the printed circuit board 30 includes a channel 32 on a forward side of the battery holder 25 which is configured to receive a side or edge 35 of the printed circuit board 30. On a rear side of the battery holder 25 a pair of deformable fastening means 37 are provided to be received in a pair of apertures 40 formed in the printed circuit board for snap fit engagement therebetween. As illustrated in FIG. 4, when the battery holder 25 is mounted to the printed circuit board 30, the forward edge 35 of the printed circuit board is securely received in the channel 32, and the deformable fastening means 37 are received in the apertures 40 and engage the printed circuit board for providing secure retention of the battery holder 25 on the printed circuit board. The fastening means 32, 40 cooperate to hold the battery holder 25 in spaced relation to the printed circuit board 30 so that a space 43 (FIG. 4) is provided therebetween. In this way, various circuit components 47, 49 may be mounted on the printed circuit board 30 between the printed circuit board and the battery holder 25.

Referring again to FIG. 3, the battery holder 25 includes a pair of juxtaposed chambers 50, 51, each chamber being configured to receive a battery 27. The internal circumference of each chamber 50, 51 is slightly larger than the external circumference of the battery 27 so that the battery is securely retained therein and the movement of a battery 27 is extremely limited when inserted in one of the chambers 50, 51. The battery holder 25 is also provided with a retention clip 56 for retaining batteries within the chambers 50, 51.

Referring also to FIGS. 5 and 6, a resiliently deformable arm 58 of the retention clip 56 is deformable in response to a force applied by an operator for insertion of a battery 27 within one of the chambers 50, 51. In FIG. 5, the retention clip 56 is shown in its deformed or displaced position, with its normal or non-displaced position being shown in phantom at 56a. In FIGS. 3, 4 and 6, the retention clip 56 is shown as including an extension tab 61 for engagement with a finger of an operator so that the retention clip may be easily repositioned for insertion of a battery within a chamber.

During insertion or removal of a battery within one of the chambers 50, 51, a force is applied to the tab 61 in the direction of the arrow 59 of FIG. 5. Once the retention clip 56 is repositioned as shown at 56a in FIG. 5, the entrances to chambers 50, 51 are clear so that a battery may be inserted within each chamber. In FIG. 5, a battery is shown in phantom at 27a after being inserted within the chamber 51 with the retention clip in its displaced position 56a.

Referring to FIGS. 3 and 6, when the retention clip 56 is returned to its normal position, a back surface 63 of the retention tab 61 engages a forward end of the battery to thereby securely hold the battery within a chamber. The distance between a back end 67 of each channel 50, 51 and the back surface 63 of the retention clip 56 is slightly greater than the axial length of a battery 27 to thereby limit the actual movement of the battery 27 when positioned within a chamber 50, 51.

On either side of the battery 27, electrical contact means 72 are mounted thereon for providing an electrical contact with the battery. Attached to one end 75 of each electrical contact means 72 is a conductor 78 for providing an electrical path between the battery 27 and a known type of connector 82. As illustrated in FIG. 3, a male connector 82 is attached to the battery conductors 78, and a female connector 85 is mounted on the printed circuit board. Upon engagement of the male connector 82 with the female connector 85 a complete circuit path is provided between the battery 27 and the printed circuit board 30. Various electrical connections (not shown) may be provided between the female connector 85 mounted on the printed circuit board and various circuit components (not shown) mounted on the printed circuit board 30.

Referring again to FIGS. 2 and 3, when the battery holder 25 is mounted to the printed circuit board 30, a cutout section 90 is provided in the front of the battery holder 25 to thereby provide for the connection and removal of the male connector 82 from the female connector 85. Therefore, access is provided for installation and removal of a battery from the battery holder 25 without removal of the printed circuit board from the housing 10.

Although the invention is illustrated with having a single pair of connectors 82 and 85 for establishing a connection between a single battery 27 and the printed circuit board 30, additional connectors may be provided on the printed circuit board for receiving additional male connectors 82 attached to batteries if more than one battery is required for providing power to the printed circuit board 30. Alternatively, several batteries may be interconnected to a single male connector for connection to the female connector 85 mounted on the printed circuit board 30.

Although the invention is illustrated herein as having circular chambers 50, 51 for receiving a cylinder shaped battery 27, it will be understood by those skilled in the art that the invention will work equally as well with various shaped chambers for receiving similarly shaped batteries, e.g., a rectangular or square shaped chamber for receiving a rectangular or square shaped battery. Additionally, although the invention is shown and illustrated as including two chambers within the battery holder 25, it will be understood by those skilled in the art that the invention would work equally as well with a single chamber in the battery holder. Additionally, it is apparent that the invention would also work equally as well with more than two chambers provided for receiving batteries in those instances where more than two batteries are required for powering the printed circuit board 30. In this case, for each N chambers provided, where N is an integer, N–1 retention clips would be provided, with a retention clip being positioned between each pair of juxtaposed batteries. This relationship works for all number of N batteries with the exception of one chamber being provided, in which case at least one retention clip would be required for retaining the battery within the chamber.

Although the invention has been described and illustrated with respect to exemplary embodiments thereof, it should be understood by those skilled in the art that the foregoing and various other changes in the omissions may be made therein and thereto without departing from the spirit and scope of the present invention.

What is claimed is:

1. A battery holder for mounting on a printed circuit board comprising:

at least one battery chamber having a chamber open end for receiving a battery therein;

retention clip means positioned adjacent to said chamber open end, said retention clip means preventing a battery from being inserted in and removed from said at least one battery chamber through said chamber open end when said retention clip is in a non-actuated position, said retention clip allowing a battery to be inserted in and removed from said at least one battery chamber through said chamber open end when said retention clip is in an actuated position; and mounting means for mounting the battery holder to the printed circuit board, said mounting means holding said at least one battery chamber in spaced relation to said printed circuit board, thereby allowing the mounting of circuit components on the printed circuit board between the battery holder and the printed circuit board.

2. A battery holder according to claim 1 wherein said mounting means comprises first mounting means on a front end of the battery holder adjacent to said chamber open end, said first mounting means having a channel formed therein for engaging an edge of the printed circuit board;

second mounting means on a rear end of the battery holder opposite to said front end, said second mounting means being received in apertures formed in the printed circuit board and being configured for snap fit engagement therewith; and wherein said first mounting means and said second mounting means cooperate to securely hold the battery holder to the printed circuit board with said at least one battery chamber in spaced relation to the printed circuit board.

3. A battery holder according to claim 2 wherein said retention clip means comprises:

a retention tab;

a resiliently deformable arm mounted on one end to a rear side of the battery holder and having said retention tab mounted on the other end thereof, said arm holding said retention tab adjacent to said chamber open end; and a contacting surface on a rear side of said retention tab for engagement with an end of a battery installed in said at least one battery chamber when said retention clip means is in said non-actuated position.

4. A battery holder according to claim 3 wherein for each N chambers in the battery holder, where N is a whole number, if N is greater than 1 there are M retention clip means, where M is equal to N–1, and wherein M is equal to 1 if N is equal to 1.

5. A battery holder according to claim 4 wherein the printed circuit board is mounted within a housing, and wherein an access is provided in said housing for accessing the battery holder, whereby a battery is installed in, and removed from, said at least one battery chamber without removing the printed circuit board from said housing.

6. A battery holder according to claim 4 wherein a connector is mounted on the printed circuit board for engagement with a battery connector, which is connected via a pair of electrically conducting leads to terminals of a battery, and wherein the battery holder further comprises a cutout for providing access to the connector mounted on the printed circuit board when the battery holder is mounted to the printed circuit board.

7. A battery holder according to claim 6 wherein the printed circuit board is mounted within a housing, and wherein an access is provided in said housing for accessing the battery holder and the connector mounted on the printed circuit board, whereby a battery is installed in and removed from said at least one battery chamber, and the battery connector is connected to and disconnected from the connector mounted on the printed circuit board without removing the printed circuit board from the housing.

8. A battery holder according to claim 7 wherein said cutout is provided on a side of the battery holder adjacent to said chamber open end.

9. A battery holder according to claim 7 wherein said at least one battery chamber is cylindrical in shape for receiving a cylindrically shaped battery.

10. A battery holder according to claim 9 wherein the internal diameter of said at least one battery chamber is slightly larger than an external circumference of a battery to be received therein for limiting the movement of the battery within said at least one battery chamber, and wherein the distance between a surface of said rear side of the battery holder and said contacting surface is slightly longer than an axial length of a battery to be received in said at least one battery chamber.

11. A battery holder according to claim 10 wherein said cutout is provided on a side of the battery holder adjacent to said chamber open end.

12. A battery holder according to claim 1 wherein the internal dimensions of said at least one battery chamber are slightly larger than the external dimensions of a battery to be received therein for limiting the movement of a battery within said at least one battery chamber.

13. A battery holder according to claim 12 wherein said at least one battery chamber is cylindrical in shape for receiving a cylindrically shaped battery.

14. A battery holder according to claim 1 wherein said retention clip means comprises:

a retention tab;

a resiliently deformable arm mounted on one end to a rear side of the battery holder and having said retention tab mounted on the other end thereof, said arm holding said retention tab adjacent to said chamber open end; and a contacting surface on a rear side of said retention tab for engagement with an end of a battery installed in said at least one battery chamber when said retention clip means is in said non-actuated position.

15. A battery holder according to claim 14 wherein the internal dimensions of said at least one battery chamber are slightly larger than the external dimensions of a battery to be received therein for limiting the movement of a battery within said at least one battery chamber, and wherein the distance between a surface of said rear side of the battery holder and said contacting surface is slightly longer than the length of a battery to be received in said at least one battery chamber.

16. A battery holder according to claim 1 wherein for each N chambers in the battery holder, where N is a whole number, if N is greater than 1 there are M retention clip means, where M is equal to N−1, and wherein M is equal to 1 if N is equal to 1.

17. A battery holder according to claim 1 wherein a connector is mounted on the printed circuit board for engagement with a battery connector, which is connected via a pair of electrically conducting leads to terminals of a battery, and wherein the battery holder further comprises a cutout for providing access to the connector mounted on the printed circuit board when the battery holder is mounted to the printed circuit board.

18. A battery holder according to claim 17 wherein said cutout is provided on a side of the battery holder adjacent to said chamber open end.

19. A battery holder according to claim 17 wherein the printed circuit board is mounted within a housing, and wherein an access is provided in said housing for accessing the battery holder and the connector mounted on the printed circuit board, whereby a battery is installed in and removed from said at least one battery chamber, and the battery connector is connected to and disconnected from the connector mounted on the printed circuit board without removing the printed circuit board from the housing.

20. A battery holder according to claim 1 wherein the printed circuit board is mounted within a housing, and wherein an access is provided in said housing for accessing the battery holder, whereby a battery is installed in and removed from said at least one battery chamber without removing the printed circuit board from said housing.

* * * * *